(12) United States Patent
Biswas

(10) Patent No.: US 11,927,630 B1
(45) Date of Patent: Mar. 12, 2024

(54) SYSTEM AND METHOD FOR SCHEDULE-BASED I/O MULTIPLEXING FOR INTEGRATED CIRCUIT (IC) SCAN TEST

(71) Applicant: Marvell Asia Pte, Ltd., Singapore (SG)

(72) Inventor: Sounil Biswas, San Jose, CA (US)

(73) Assignee: Marvell Asia Pte Ltd, Singapore (SG)

( * ) Notice: Subject to any disclaimer, the term of this patent is extended or adjusted under 35 U.S.C. 154(b) by 146 days.

(21) Appl. No.: 17/500,453

(22) Filed: Oct. 13, 2021

Related U.S. Application Data

(60) Provisional application No. 63/091,279, filed on Oct. 13, 2020.

(51) Int. Cl.
| | |
|---|---|
| *G01R 31/3177* | (2006.01) |
| *G01R 31/317* | (2006.01) |
| *G01R 31/3185* | (2006.01) |
| *G01R 31/319* | (2006.01) |
| *G06F 30/34* | (2020.01) |
| *G11C 7/10* | (2006.01) |
| *G11C 11/4093* | (2006.01) |
| *G11C 11/4096* | (2006.01) |

(52) U.S. Cl.
CPC .... *G01R 31/3177* (2013.01); *G01R 31/31713* (2013.01); *G01R 31/3172* (2013.01); *G01R 31/318513* (2013.01); *G01R 31/318572* (2013.01); *G01R 31/31926* (2013.01); *G06F 30/34* (2020.01); *G11C 7/10* (2013.01); *G11C 11/4093* (2013.01); *G11C 11/4096* (2013.01)

(58) Field of Classification Search
CPC ........ G01R 31/318563; G01R 31/3172; G01R 31/2815; G01R 31/31713; G01R 31/3185; G01R 31/31926
See application file for complete search history.

(56) References Cited

U.S. PATENT DOCUMENTS

| | | | |
|---|---|---|---|
| 7,594,212 B1 * | 9/2009 | Gaitonde | G06F 30/39 716/124 |
| 2012/0124437 A1 * | 5/2012 | Xie | G01R 31/318533 714/E11.155 |

* cited by examiner

*Primary Examiner* — April Y Blair
*Assistant Examiner* — Sazzad Hossain

(57) ABSTRACT

An approach is proposed to support schedule-based I/O multiplexing for scan testing of an IC. A plurality of I/Os are assigned to a plurality of blocks in the IC for scan testing based on a set of slots under a set of schedules. Each of the set of slots includes a fixed number of scan input pins/pads and scan output pins/pads of the IC. Each slot is then assigned to a specific block on the IC for the scan test until all of the slots available are utilized. The group of assigned blocks is referred to as a schedule, and all of these blocks belonging to this schedule are scan tested in parallel at the same time. The remaining blocks on the IC are also assigned to the slots until all blocks on the IC are assigned to a schedule to be scan tested.

19 Claims, 5 Drawing Sheets

| Schedule-0 | Schedule-1 |
|---|---|
| A | B |
| D | C |
| E | F |
| H | G |
| L | K |

| Schedule-0 | Schedule-1 |
|---|---|
| A1 | B |
| A2 | C1 |
| A3 | C2 |
| A4 | C3 |
| D | F1 |
| E | F2 |
| H1 | G1 |
| H2 | G2 |
|  | G3 |
|  | K1 |
| L | K2 |

SYSTEM AND METHOD FOR SCHEDULE-BASED I/O MULTIPLEXING FOR INTEGRATED CIRCUIT (IC) SCAN TEST

CROSS-REFERENCE TO RELATED APPLICATIONS

This application claims the benefit of U.S. Provisional Patent Application No. 63/091,279, filed Oct. 13, 2020, which is incorporated herein in its entirety by reference.

BACKGROUND

As new bleeding-edge technology continues to scale down, more and more logic gates are being incorporated within a single integrated circuit (IC)/chip or apparatus. Over time, this trend has led to an exponential increase in the complexity of IC testing. Design for scan testing (also known as scan DFT) of an IC is a mechanism aimed at checking the internal components/blocks of the IC to increase its testability. This includes, but is not limited to, one or more of scan chain test, stuck-at test, and at-speed test. Over the past decade or so scan testing has suffered a significant increase in complexity with the increase in IC die size and/or logic density. One of the key reasons behind this increase in the scan test complexity is the lack of equivalent growth in scannable I/O pins (also referred to as scan I/Os) available on the IC. Naturally, modern ICs have far fewer I/Os than required for testing the entire IC in parallel. Moreover, power consumption is a concern when the entire IC is under test at the same time. These issues have led to some key requirements for scan testing of ICs at these bleeding-edge technology nodes. First, to optimize shift and capture power consumption during a scan test, it is likely better to time multiplex place and route (PNR) or physical blocks (referred to herein as "blocks") of an IC during test instead of trying to test all of the blocks in parallel. Second, direction of the scan I/Os should not be modified for an IC in order to maximize pattern compression on the automatic test equipment (ATE). As a result of these two requirements, scan I/O availability is further constrained for an IC, and subsequently this must be addressed during the development of test strategy of the IC.

The industry-wide solutions that are available at this time to address the two problems described above can be categorized into three broad categories: (i) adding dedicated scan-only pins, (ii) reducing pin usage per block, and (iii) sharing scan I/Os among identical as well as non-identical blocks. The first option may be quite expensive in modern IC designs as I/O inclusion is expensive not only to the die area but also from the perspective of package design. In turn, the second option can reduce the number of scan I/Os by looking into variable compression mechanism to optimize the number of scan I/Os dedicated per PNR block. However, it adds significant complexity to scan DFT effort in an IC. This, in turn, may lead to added time and cost of scan DFT of the IC, especially in very large ICs or ICs that are sensitive to design duration. Finally, the third option also adds significant scan test complexity that may range from non-identical blocks being driven by same inputs where fault targeting becomes quite complex to output sharing where defects from a block may be masked by another block. All of these issues can contribute to increases in scan test pattern count, test time, and/or scan coverage drop. Moreover, none of these options is easily scalable across a range of ICs and are not ideal for IP reuse across different IC designs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
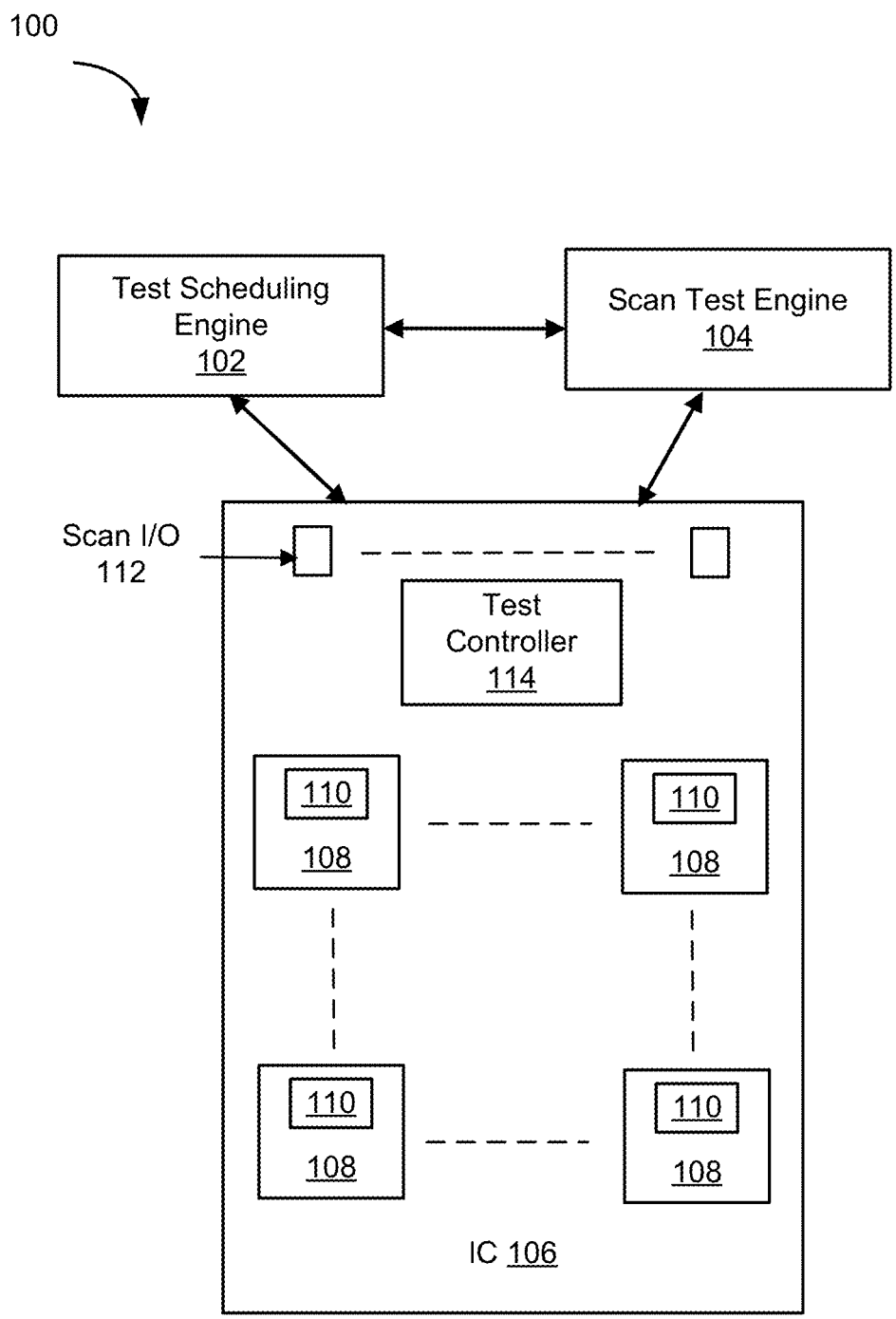
FIG. 1 depicts an example of a diagram of a system to support schedule-based I/O multiplexing for IC scan testing according to one aspect of the present embodiments.

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein. It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

A new approach is proposed that contemplates systems and methods to support schedule-based I/O multiplexing (MUX) for scan testing of an IC. Depending on the number I/Os available on the IC, a plurality of I/Os are assigned to a plurality of blocks in the IC for scan testing based on a set of slots under a set of schedules. Each of the set of slots includes a fixed number of scan input pins/pads and scan output pins/pads of the IC. Given a number of available scan I/Os on the IC, there will be a specific number of slots available. Each slot is then assigned to a specific block on the IC for the scan test. The slots are assigned to the plurality of blocks until all of the slots available are utilized. Once assigned with slots, the group of assigned blocks is referred to as a first schedule and all of these blocks belonging to this schedule are scan tested in parallel at the same time. The remaining blocks on the IC are also assigned to the set of slots until all of the slots are utilized again, wherein the group of assigned blocks constitutes the next/second schedule. This process continues until all blocks on the IC are assigned to a slot in a schedule and are scan tested according to their assigned schedules.

The proposed approach addresses the issue of scalability and efficiency in scan testing of ICs that scales across a spectrum of varied ranges of block count to available scan I/O ratio. Specifically, the proposed approach can be extended to or applied to all ranges of ICs that include but are not limited to ICs with few blocks and few scan I/Os, ICs with very large number of blocks and large number of scan I/Os, and ICs with very large number of blocks but few scan I/Os. By sharing scan I/Os among blocks that may be non-identical, the proposed approach reduces routing resource required and routing congestion caused by routing wires to the shared scan I/Os within the IC. Additionally, the proposed approach simplifies re-use of scan routing in derivative ICs, which are ICs derived from other ICs previously taped out, by standardizing scan connectivity to enable easy replacement of current blocks with new blocks necessary in the derivative ICs. As the blocks get reused in multiple IC designs, the proposed approach makes block reuse simple from scan DFT perspective.

FIG. 1 depicts an example of a diagram of a system 100 to support schedule-based I/O multiplexing for IC scan testing. Although the diagram depicts components as functionally separate, such depiction is merely for illustrative purposes. It will be apparent that the components portrayed in this figure can be arbitrarily combined or divided into separate software, firmware and/or hardware components. Furthermore, it will also be apparent that such components, regardless of how they are combined or divided, can execute on the same host or multiple hosts, and wherein the multiple hosts can be connected by one or more networks.

In the example of FIG. 1, the system 100 includes a test scheduling engine 102, a scan test engine 104, and an IC 106 being scan tested. Each of the engines in the system 100 is a computing unit/hardware/host with software instructions running on such computing unit/hardware/host. In some embodiments, one or more of these engines are programmable by a user via software instructions for various test-related operations. When the software instructions are executed, the computing unit/hardware/host becomes a special purposed hardware component for practicing the test-related operation.

In the example of FIG. 1, the IC 106 being tested includes a plurality of independent physical blocks/modules 108s, a plurality of scan I/O pins/pads (or I/Os) 112s that can be utilized as input and/or outputs to the plurality of blocks 108s, and a test controller 114 configured to control the scan test of the plurality of blocks 108s. In some embodiments, the plurality of blocks 108s can be further classified into one or more functional types, wherein each of the one or more sub-categories further includes one or more blocks 108s. In some embodiments, each of the plurality of blocks 108s further includes a scan hub component 110 discussed in detail below. In some embodiments, the plurality of scan I/Os 112s can be further classified into a set of one or more scan input only pins/pads, a set of one or more scan output only pins/pads, and a set of one or more pins/pads that can be used for either scan input or output.

In the example of FIG. 1, the test scheduling engine 102 is configured to first collect information of the IC 106 being tested for scheduling purposes. Here, the information collected includes but is not limited to the number of blocks 108s on the IC 106, the one or more functional types of the blocks 108s, and the number of blocks 108s that belong to each of the one or more functional types. The information collected further includes the number of scan I/Os 112s on the IC 106 and the numbers of the scan I/Os 112s that are input only pins, output only pins, and input/output pins, respectively.

Depending on the number and types of the plurality of scan I/Os 112s available on the IC 106, the test scheduling engine 102 is configured to time multiplex the plurality of scan I/Os 112s to the blocks 108s on the IC 106 so that the blocks 108s may be accessed via the plurality of scan I/Os 112s for a scan test. Specifically, in some embodiments, the test scheduling engine 102 is configured to divide the plurality of scan I/Os 112s into a set of one or more slots, wherein each of the set of one or more slots includes a certain number of scan input pins and a certain number of scan output pins on the IC 106. Given the number of available scan I/Os 112s on the IC 106, there are a certain/limited number of slots available on the IC 106. The test scheduling engine 102 is then configured to assign each slot having one or more scan inputs and one or more scan outputs to a specific block 108 on the IC 106 for the scan test until all of the set of one or more slots of I/Os 112s on the IC 106 have been assigned to their respective blocks 108s. In some embodiments, the test scheduling engine 102 defines the group of blocks 108s that have been assigned with the set of one or more slots as a first schedule, wherein all of the blocks 108s in the same/first schedule can then be scan tested together by the scan test engine 104 at the same time via their assigned slots. If there are unassigned blocks 108s remaining on the IC 106, the test scheduling engine 102 is then configured to assign the set of slots to the remaining blocks 108s on the IC 106, wherein the newly assigned blocks 108s constitute the next/second schedule to be scan tested together by the scan test engine 104 at a time point/stamp after the blocks 108s in the first schedule have been scan tested. This assignment process continues until all blocks 108s on the IC 106 are assigned by the test scheduling engine 102 to at least a slot in one of the schedules.

In some embodiments, the schedule-slot approach to scan I/O assignment for scan testing discussed above enables the scan I/Os 112s to be shared among non-identical blocks on the IC 106. In some embodiments, a set of blocks 108s belonging to different schedules of the set of schedules can share the same slot of scan I/Os 112s. By sharing scan I/Os 112s among non-identical blocks across schedules, the schedule-slot approach leads to significant reduction in scan wire usage/congestion within the IC 106. In some embodiments, when there are multi-instantiations of a single block 108, the scan input pins can be shared among the multiple instances of the block 108, while the scan output pins must be separate. Consequently, the number of scan input slots and output slots can be different within each schedule. For a non-limiting example, if there are three instances of a block 108, the three instances of the block 108 may occupy a single input pin in a slot in a schedule but may require three separate output pins in three slots in that same schedule. However, the number of slots of scan input and/or scan output pins can be the same across different schedules.

Figures 2A, 2B:
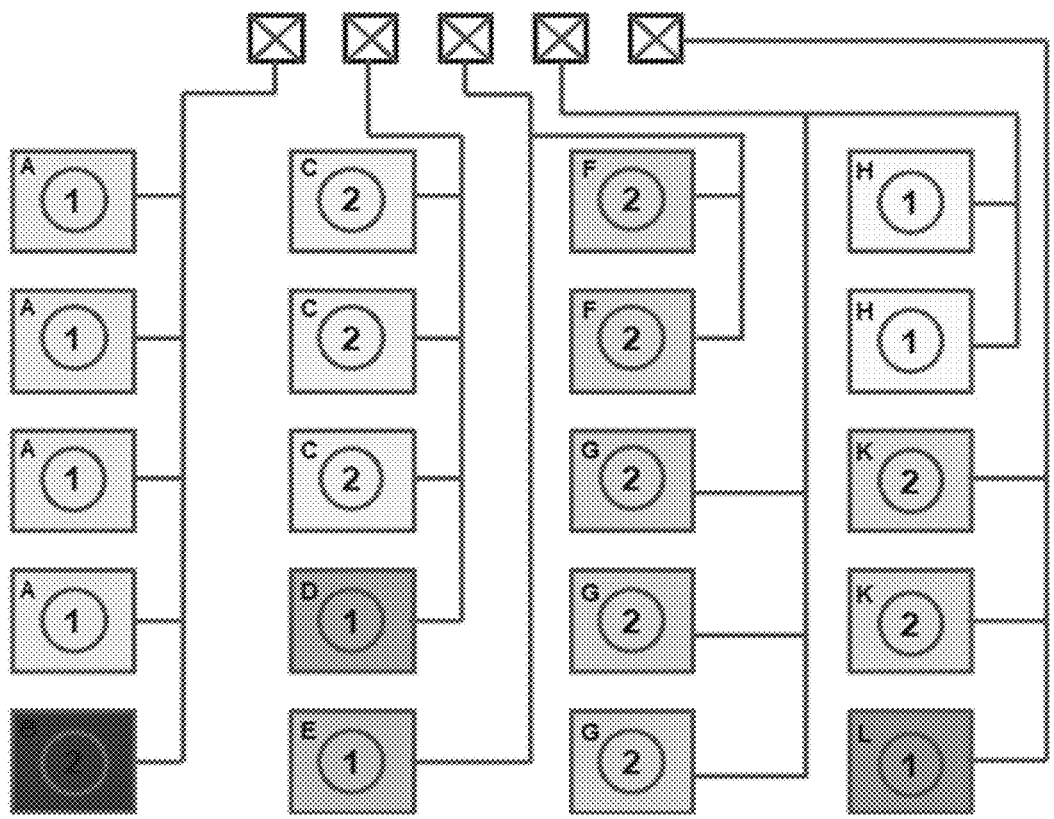
FIGS. 2A-2D depict a non-limiting example of slot and schedule assignment for scan testing of an IC having 20 blocks of 10 different types according to one aspect of the present embodiments.
Figures 2C, 2D:
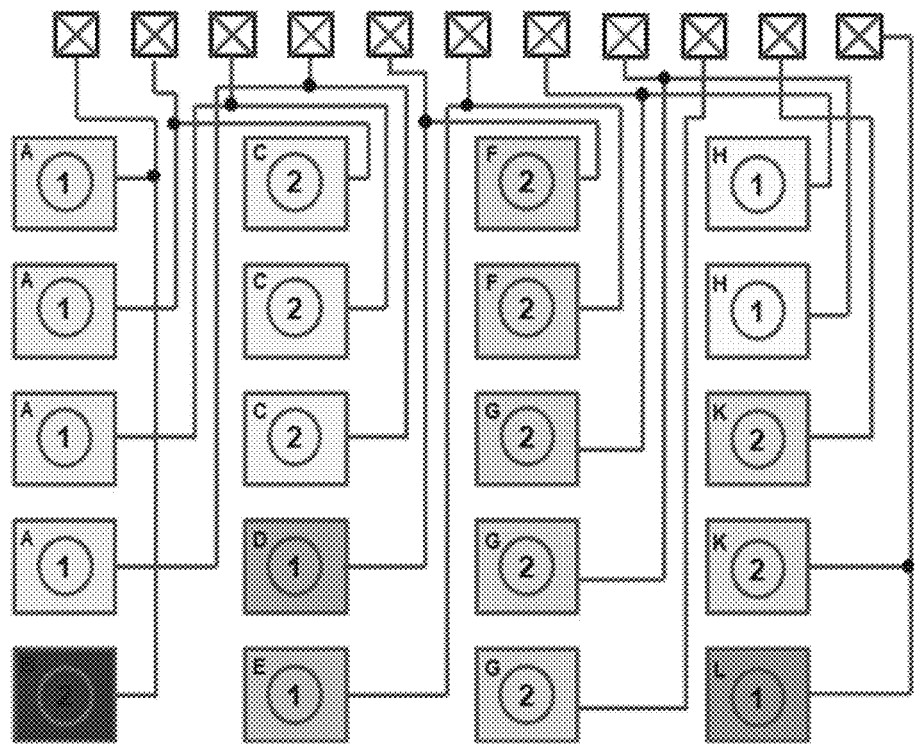

FIGS. 2A-2D depict a non-limiting example of slot and schedule assignment for scan testing of an IC having 20 blocks of 10 different types. As depicted in FIG. 2A, block A is instantiated four times, block B is instantiated once, block C is instantiated three times, block D is instantiated once, block E is instantiated once, block F is instantiated twice, block G is instantiated three times, block H is instantiated twice, block K is instantiated twice, and block L is instantiated once. Assuming that each module requires a single scan input and a single scan output, these 20 blocks can be fit into two schedules—Schedule 0 and Schedule 1 with 5 input pads and 11 output pads on the IC. FIGS. 2A and 2C depict the assignment of the 5 scan input pads and the 11 scan output pads to the 20 blocks, respectively. The tables in FIGS. 2B and 2D show the input and output slot assignment of the blocks to the two schedules, respectively. Note that the dots shown in FIG. 2C represent OR gates used to combine the outputs from the blocks. The non-limiting example of FIGS. 2A-2D can be extended to the scenario where each block requires M inputs and N outputs. In that case, 5M and 11N input pads and output pads would be required, respectively, to accommodate the scan test of the blocks in two schedules.

Once the schedules for scan testing of the IC 106 have been generated/pre-determined by the test scheduling engine 102, a scan hub ID, which is a set of bits (e.g., bits tied to ground or VDD), is created and assigned to the one or more blocks 108s on the IC 106 that belong to the same schedule on the IC via a test controller 114. All blocks 108s within the same schedule are assigned the same scan hub/schedule ID. Since different schedules have different scan hub IDs, the scan hub ID is also referred to as the schedule ID. Based on the schedules created by the test scheduling engine 102, the scan test engine 104 is configured to conduct/run the scan test of the blocks 108s having the same scan ID via the slots assigned to the blocks and according to the schedules as ordered by their timestamps. The schedule of the blocks 108s currently chosen by the scan test engine 104 for scan testing is referred to as an active schedule. In some embodiments, the scan test engine 104 may need to make adjustments to one of the pre-determined schedules during testing, e.g., to include and/or exclude a certain block 108 from the current active schedule. In this case, the scan test engine 104 is configured to overwrite the scan hub ID of one or more selected blocks 108s for which test schedules need to be adjusted via the test controller 114. As a result of the scan hub ID overwriting during the scan test, one or more certain blocks are included in the current active schedule and other one or more certain blocks are dropped from the current active schedule for the scan test of the IC 106.

Figure 3A:
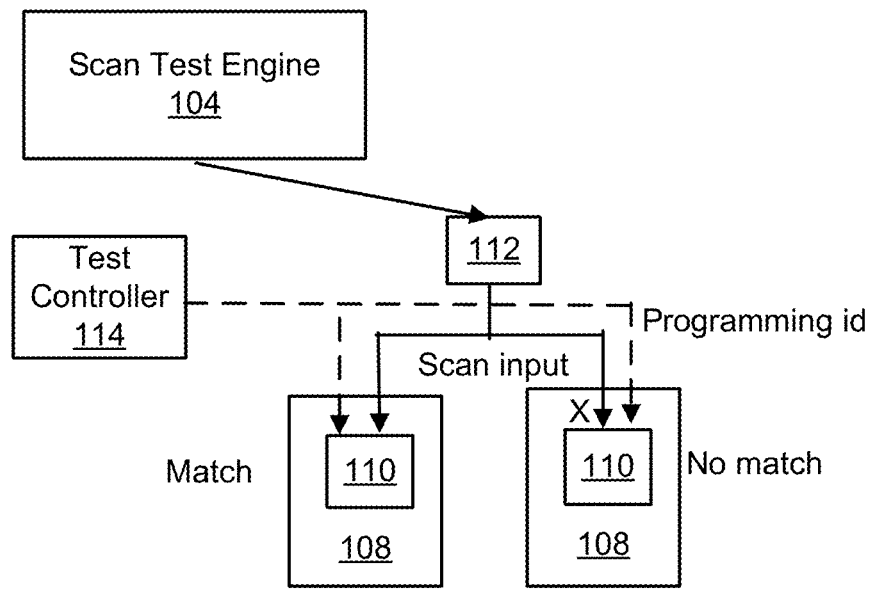
FIGS. 3A-3B depict a non-limiting example of a block being scan tested in an active schedule based on its scan hub ID according to one aspect of the present embodiments.
Figure 3B:
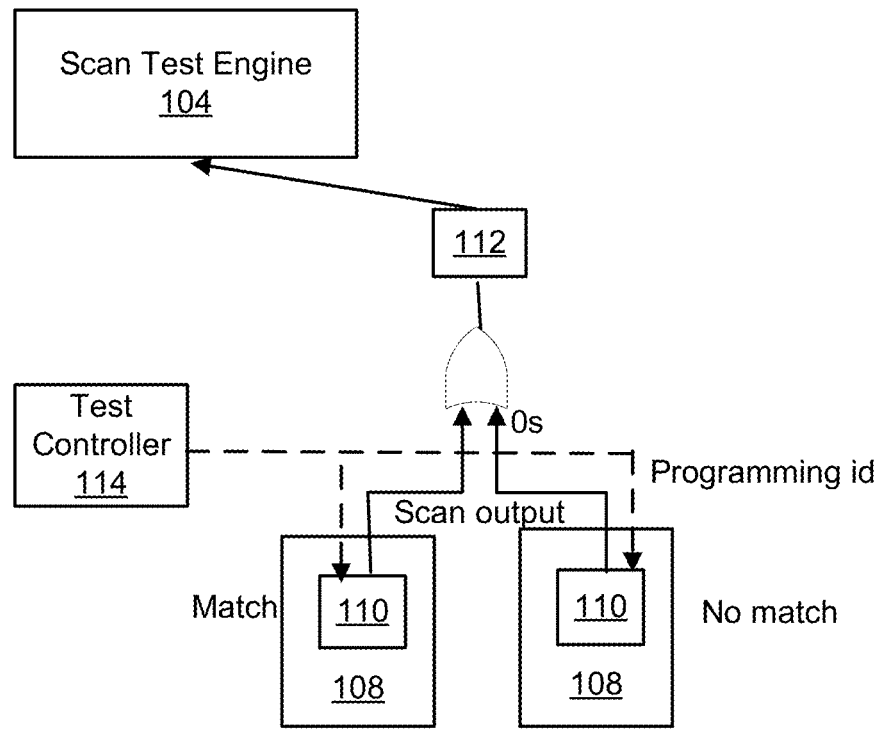

In some embodiments, each block 108 on the IC 106 further includes a scan hub component 110 configured to accept and maintain the scan hub ID of the block 108 and to determine if the block 108 belongs to the current active schedule of blocks 108s being tested by the scan test engine 104. A block 108 is being scan tested in the active schedule by the scan test engine 104 based on its scan hub ID as illustrated by a non-limiting example depicted in FIGS. 3A-3B. Specifically, in some embodiments, when the active schedule of blocks 108s is being scan tested, the test controller 114 is configured to broadcast a schedule programming signal/number/identification (represented by the dotted lines in FIGS. 3A and 3B) representing a set of blocks to be tested in the current active schedule to all blocks 108s in the IC 106. The scan hub component 110 in each of the blocks 108s is configured to accept and compare the broadcasted schedule programming signal to the scan hub ID maintained and associated with the block. If these two numbers match, meaning that block 108 belongs to the current active schedule, the scan hub component 110 of the block 108 allows scan inputs from the scan test engine 104 to the input pads of the IC 106 to pass through to the block 108 to be scan tested as shown by the solid lines in FIG. 3A and allows scan outputs from the block 108 to be sent to the scan output pads and then to the scan test engine 104 as shown by the solid lines in FIG. 3B. If these two numbers do not match, meaning the block 108 does not belong to the current active schedule, the scan inputs to the input pads are gated off at the scan hub component 110 (FIG. 3A) and the scan outputs from the block 108 are also set to binary 0s at an OR gate of the scan output pad (FIG. 3B). As such, the value from the block 108 will not affect the current scan test output. In this manner, the scan test engine 104 is configured to scan test the one or more blocks 108s belonging to each schedule in parallel, and to sequentially select the schedules until all of the plurality of blocks 108s in the IC 106 have been scan tested.

In some embodiments, the test controller 114 is configured to generate or broadcast the schedule programming signal to the plurality of blocks 108 on the IC 106 in various fashions. In some embodiments, a dedicated test data register (not shown) in the test controller 114 is utilized to program the scan hub ID of the current active schedule during the scan test, which enables the blocks 108s to be broken into the different schedules. In some embodiments, the test controller 114 is configured to broadcast the schedule programming signal to all blocks 108s that belong to the same slot across different schedules for the same set of scan input pins. For scan outputs, the test controller 114 is configured to combine (e.g., perform an OR operation on) the scan output data from the blocks 108s belonging to the same slot across different schedules together before sending a single set of scan output data to the output pads and then to the scan test engine 104. Such output mechanism works since scan output from the blocks 108s that are not in the current schedule are set to binary zero by their respective scan hub components 110s.

Figure 4:
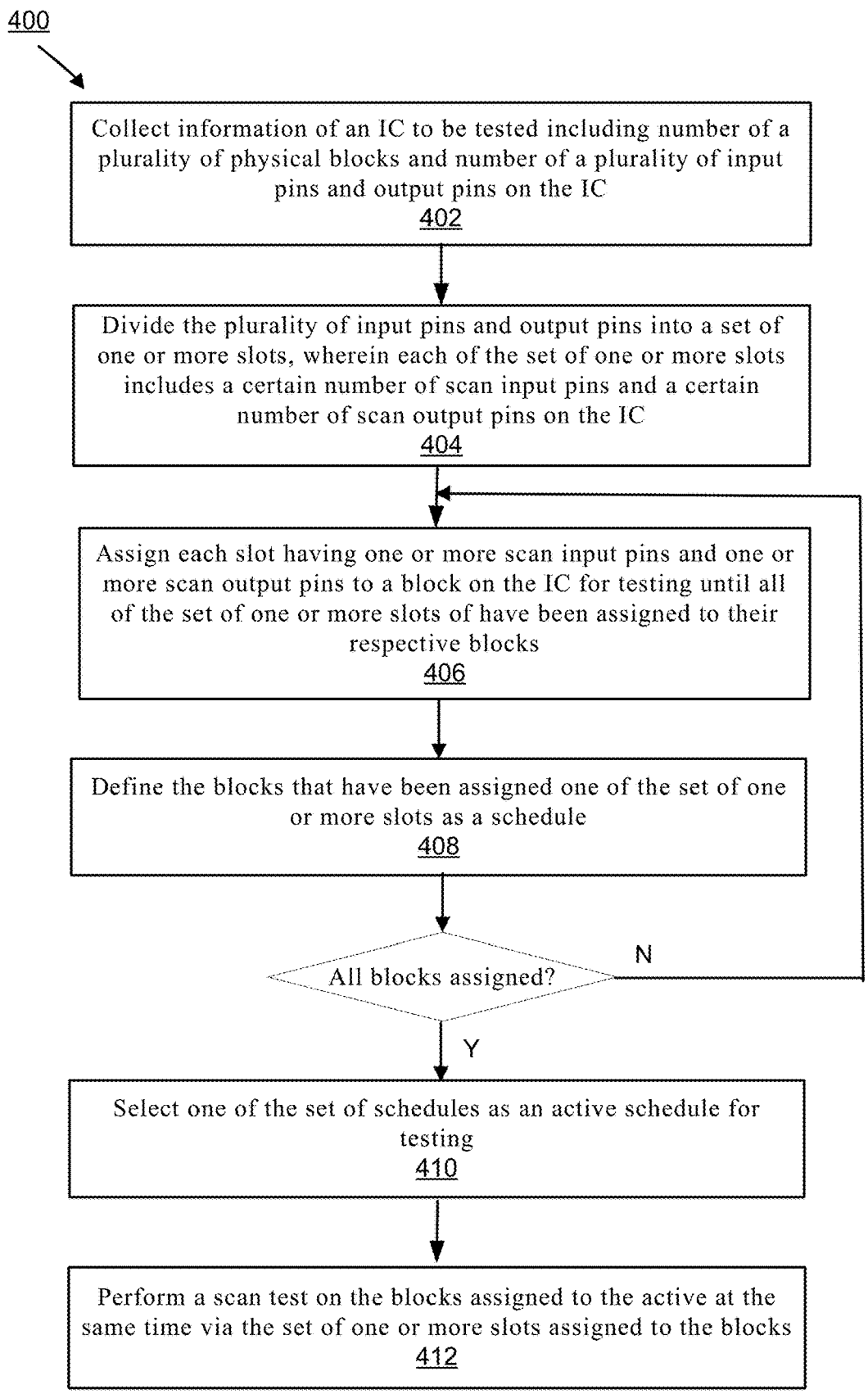
FIG. 4 depicts a flowchart of an example of a process to support schedule-based I/O multiplexing for IC scan testing according to one aspect of the present embodiments.

FIG. 4 depicts a flowchart 400 of an example of a process to support schedule-based I/O multiplexing for IC scan testing. Although the figure depicts functional steps in a particular order for purposes of illustration, the processes are not limited to any particular order or arrangement of steps. One skilled in the relevant art will appreciate that the various steps portrayed in this figure could be omitted, rearranged, combined and/or adapted in various ways.

In the example of FIG. 4, the flowchart 400 starts at block 402, where information of an IC to be tested is collected including number of a plurality of physical blocks and number of a plurality of input pins and output pins on the IC. The flowchart 400 continues to block 404, where the plurality of input pins and output pins is divided into a set of one or more slots, wherein each of the set of one or more slots includes a certain number of scan input pins and a certain number of scan output pins on the IC. The flowchart 400 continues to block 406, where each slot having one or more scan input pins and one or more scan output pins is assigned to a block on the IC for testing until all of the set of one or more slots have been assigned to their respective blocks. The flowchart 400 continues to block 408, where the blocks that have been assigned one of the set of one or more slots is defined as a schedule. The blocks 406 and 408 are repeated until each of the plurality of blocks on the IC has been assigned to a slot in one of a set of schedules. The flowchart 400 continues to block 410, where one of the set of schedules is selected as an active schedule for testing. The flowchart 400 ends at block 412, where a scan test is performed on the blocks assigned to the active schedule at the same time via the set of one or more slots assigned to the blocks.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Embodiments were chosen and described in order to best describe the principles of the invention and its practical application, thereby enabling others skilled in the relevant art to understand the claimed subject matter, the various embodiments and the various modifications that are suited to the particular use contemplated.

What is claimed is:

1. A system, comprising:
a test scheduling engine configured to
   a) collect information of an integrated circuit (IC) to be tested including number of a plurality of physical blocks and number of a plurality of input pins and output pins on the IC;
   b) divide the plurality of input pins and output pins into a plurality of slots, wherein each slot of the plurality of slots includes a certain number of scan input pins and a certain number of scan output pins on the IC;
   c) assign each slot of the plurality of slot having one or more scan input pins and one or more scan output pins to a subset of physical blocks of the plurality of physical blocks on the IC for testing until every slot of the plurality of slots has been assigned;
   d) define the subset of physical blocks that have been assigned the plurality of slots as a schedule; and
   e) repeat steps c) and d) for physical blocks of the plurality of physical blocks that are not assigned to the plurality of slots to define additional subset of physical blocks assigned to the plurality of slots as additional schedules until each physical block of the plurality of physical blocks on the IC has been assigned, and wherein step (e) forms a set of schedules for the subset of physical blocks of the plurality of physical blocks.

2. The system of claim 1, further comprising:
a scan test engine configured to
   select one schedule of the set of schedules as an active schedule for testing; and
   perform a scan test on a subset of physical blocks assigned to the active schedule, wherein the scan test is performed on the subset of physical blocks assigned to the active schedule at the same time via the plurality of slots assigned to the subset of physical blocks assigned to the active schedule.

3. The system of claim 1, wherein:
the plurality of input pins and output pins are shared among non-identical physical blocks on the IC.

4. The system of claim 1, wherein:
a set of physical blocks belonging to different schedules of the set of schedules share the same plurality of slots.

5. The system of claim 1, wherein:
multiple instances of a single physical block share the same set of input pins but have separate output pins of the plurality of output pins.

6. The system of claim 1, wherein:
the test scheduling engine is configured to create and assign a scan hub ID to the subset of physical blocks of a subset of physical blocks that belong to the same schedule on the IC.

7. The system of claim 6, wherein:
the scan test engine is configured to adjust one of the set of schedules during the test by including and/or excluding a certain physical block on the IC from the active schedule by overwriting the scan hub ID of the certain physical block on the IC.

8. The system of claim 1, wherein:
the scan test engine is configured to choose another one of the set of schedules as an active schedule for testing until all physical blocks of the plurality of physical blocks on the IC have been tested.

9. A method, comprising:
   a) collecting information of an IC to be tested including number of a plurality of physical blocks and number of a plurality of input pins and output pins on the IC;
   b) dividing the plurality of input pins and output pins into a plurality of slots, wherein each slot of the plurality of slots includes a certain number of scan input pins and a certain number of scan output pins on the IC;
   c) assigning each slot of the plurality of slots having one or more scan input pins and one or more scan output pins to a subset of physical blocks of the plurality of physical blocks on the IC for testing until every slot of the plurality of slots has been assigned;
   d) defining the subset of physical blocks that have been assigned the plurality of slots as a schedule;
   e) repeating steps c) and d) for physical blocks of the plurality of physical blocks that are not assigned to the plurality of slots to define additional subset of physical blocks assigned to the plurality of slots as additional schedules until each physical block of the plurality of physical blocks on the IC has been assigned, and wherein step (e) forms a set of schedules for the subset of physical blocks of the plurality of physical blocks.

10. The method of claim 9, further comprising:
selecting one schedule of the set of schedules as an active schedule for testing; and
performing a scan test on a subset of physical blocks assigned to the active schedule, wherein the scan test is performed on the subset of physical blocks assigned to the active schedule at the same time via the plurality of slots assigned to the subset of physical blocks assigned to the active schedule.

11. The method of claim 9, further comprising:
sharing the plurality of input pins and output pins among non-identical physical blocks on the IC.

12. The method of claim 9, further comprising:
sharing the same plurality of slots among the subset of physical blocks belonging to different schedules of the set of schedules.

13. The method of claim 9, further comprising:
sharing the same set of input pins among multiple instances of a single physical block, wherein the multiple instances have separate output pins of the plurality of output pins.

14. The method of claim 9, further comprising:
creating and assigning a scan hub ID to the one or more physical blocks of a subset of physical blocks that belong to the same schedule on the IC.

15. The method of claim 14, further comprising:
adjusting one of the set of schedules during the test by including and/or excluding a certain physical block on the IC from the active schedule by overwriting the scan hub ID of the certain physical block on the IC.

16. The method of claim 9, further comprising:
choosing another one of the set of schedules as an active schedule for testing until all physical blocks of the plurality of physical blocks on the IC have been tested.

17. A system, comprising:
a) a means for collecting information of an IC to be tested including number of a plurality of physical blocks and number of a plurality of input pins and output pins on the IC;
b) a means for dividing the plurality of input pins and output pins into a plurality of slots, wherein each slot of the plurality of slots includes a certain number of input pins and a certain number of scan output pins on the IC;
c) a means for assigning each slot of the plurality of slots having one or more scan inputs and one or more scan outputs to a subset of physical blocks of the plurality of physical blocks on the IC for testing until every slot of the plurality of slots has been assigned;
d) a means for defining the subset of physical blocks that have been assigned the plurality of slots as a schedule; and
e) a means for repeating steps c) and d) for physical blocks of the plurality of physical blocks that are not assigned to the plurality of slots to define additional subset of physical blocks assigned to the plurality of slots as additional schedules until each physical block of the plurality of physical blocks on the IC has been assigned, and wherein step (e) forms a set of schedules for the subset of physical blocks of the plurality of physical blocks.

18. The system of claim 17 further comprising a means for selecting a schedule from the set of schedules for testing.

19. The system of claim 17 further comprising a means for performing a scan test on a subset of physical blocks assigned to an active schedule, wherein the scan test is performed on the subset of physical blocks assigned to the active schedule at the same time via the plurality of slots assigned to the subset of physical blocks assigned to the active schedule.

* * * * *